(12) United States Patent
Hayashi et al.

(10) Patent No.: US 6,370,676 B1
(45) Date of Patent: Apr. 9, 2002

(54) ON-DEMAND PROCESS SORTING METHOD AND APPARATUS

(75) Inventors: Masayuki Hayashi, Sunnyvale, CA (US); Richard F. Keil, Jonesville; Robert J. Savaglio, Jericho, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/321,048

(22) Filed: May 27, 1999

(51) Int. Cl.[7] ............................................. B06F 17/50
(52) U.S. Cl. ......................................................... 716/6
(58) Field of Search ........................ 714/736; 712/300; 371/22.3, 22.5; 716/2, 6, 8, 9

(56) References Cited

U.S. PATENT DOCUMENTS

| | | | | |
|---|---|---|---|---|
| 5,557,533 A | * | 9/1996 | Koford et al. ................. | 716/9 |
| 5,648,909 A | * | 7/1997 | Biro et al. ...................... | 716/6 |
| 5,793,644 A | * | 8/1998 | Koford et al. ................. | 716/2 |
| 5,796,751 A | * | 8/1998 | Kundu ........................... | 371/22.3 |
| 5,903,780 A | * | 5/1999 | Fushimi ........................ | 712/300 |
| 5,914,887 A | * | 6/1999 | Scepanovic et al. .......... | 716/8 |
| 5,923,676 A | * | 7/1999 | Sunter et al. ................. | 371/22.5 |
| 6,219,813 B1 | * | 4/2001 | Bishop et al. ................. | 714/736 |

* cited by examiner

*Primary Examiner*—Matthew Smith
*Assistant Examiner*—Jibreel Speight
(74) *Attorney, Agent, or Firm*—Scully, Scott, Murphy & Presser; Mark F. Chadurjian, Esq.

(57) ABSTRACT

A process sort test circuit and methodology for determining performance characteristic of an IC chip. The circuit is located on an IC chip itself and comprises an input for receiving an input signal; a first path from the input to a first output for transmitting the input signal to the first output, the first path sensitive to variations in a manufacturing process for the IC chip; a second path from the input to a second output for transmitting the input signal to the second output, the second path being substantially less sensitive to the variations in the manufacturing process for the IC chip; and, a pulse generator device coupled to the first and second outputs for detecting a difference in arrival times of the input signal at the first and second outputs and for outputting a sort signal if the difference is of a preselected magnitude. The sort signal enables output indication of a performance characteristic of the IC chip.

6 Claims, 7 Drawing Sheets

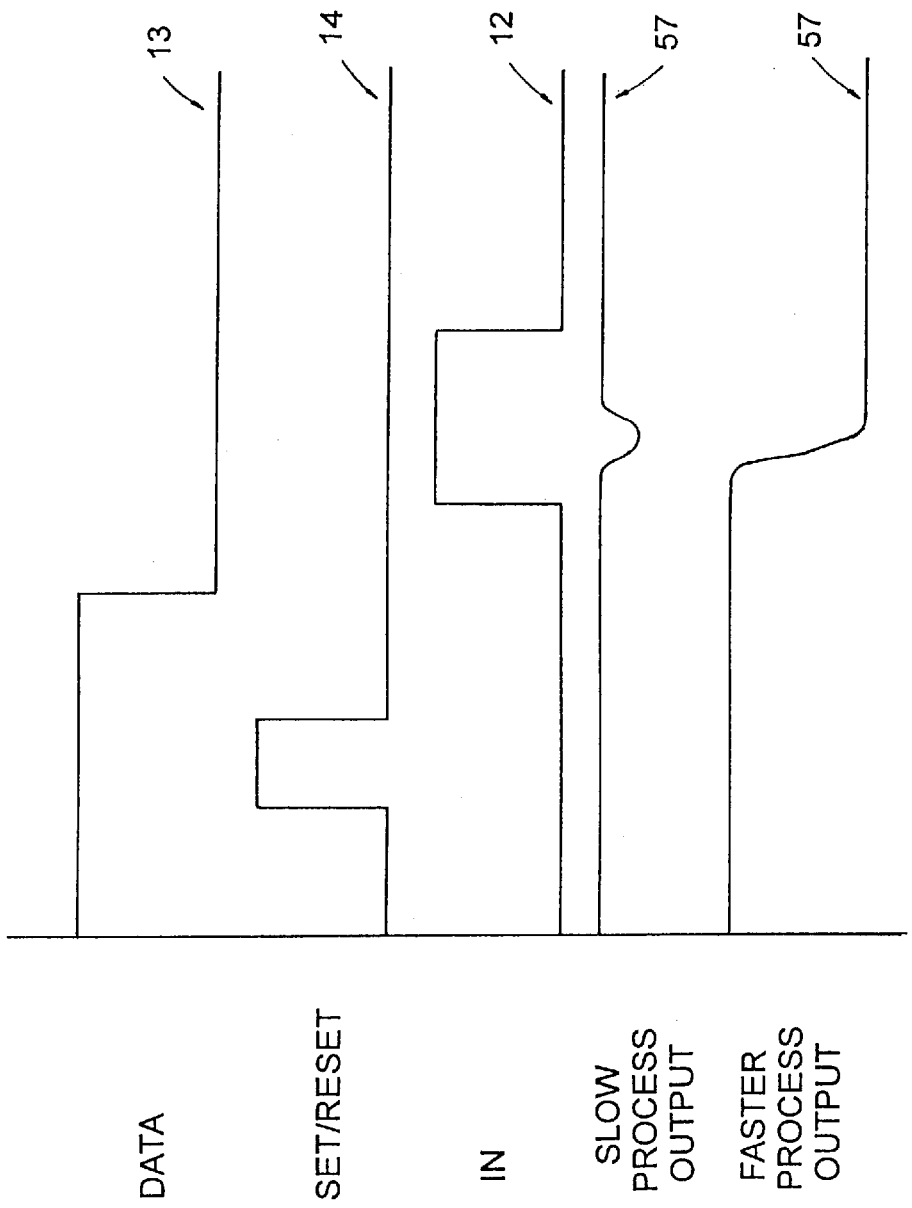
Fig. 6 PROCESS SORT ON DEMAND TIMING DIAGRAM

ON-DEMAND PROCESS SORTING METHOD AND APPARATUS

BACKGROUND OF THE INVENTION

1. Field of the Invention

The present invention is directed to integrated circuit fabrication and test methodologies, and, in particular, to a method and apparatus for providing on-demand, performance sorting at tester, card, and system levels.

2. Discussion of the Prior Art

Sorting chips for a high performance category or low performance category is typically performed by using a continuously running ring oscillator at chip level testing. That is, the chips are typically tested at chip-level test, for example, by sensing and measuring the oscillator frequency. This requires the tester to set up the test program to monitor the oscillator frequency and the chips category must be printed on the module to insure its performance category. If the chip is assembled on a module, then there is no good way to categorize whether it is a fast chip or slow chip. Even if chip was to be sorted at module or system levels, sophisticated test equipment is required with longer test times necessary.

It would be highly desirable to provide a method and apparatus for providing performance sorting at a tester, card, and at a system level, on demand, in a simple and cost-effective manner.

SUMMARY OF THE INVENTION

The present invention is directed to an integrated circuit chip testing method and apparatus that provide performance sorting at a tester, at a card, and at a system level, on demand. According to the principles of the invention, there is provided a process sort test circuit for determining performance characteristic of an IC chip, the test circuit comprising: an input for receiving an input signal; a first path from the input to a first output for transmitting the input signal to the first output, the first path sensitive to variations in the manufacturing process for the IC chip (fast path); a second path from the input to a second output for transmitting the input signal to the second output, the second path being substantially less sensitive to the variations in the manufacturing process for the IC chip (slow path); and, a pulse generator coupled to the first and second outputs, the pulse generator including means for detecting a difference in arrival times of the input signal at the first and second outputs and for outputting a sort signal if the difference is of a preselected magnitude, wherein the sort signal enables output indication of a performance characteristic of the IC chip.

BRIEF DESCRIPTION OF THE DRAWINGS

Further features, aspects and advantages of the apparatus and methods of the present invention will become better understood with regard to the following description, appended claims, and accompanying drawings where:

FIG. 6 illustrates a timing diagram for the process sort on-demand circuit of the invention.

DETAILED DESCRIPTION OF THE DRAWINGS

The present invention is directed to a method and apparatus for providing chip performance sorting at a tester, at a card, and at a system level, on demand.

Figure 1:
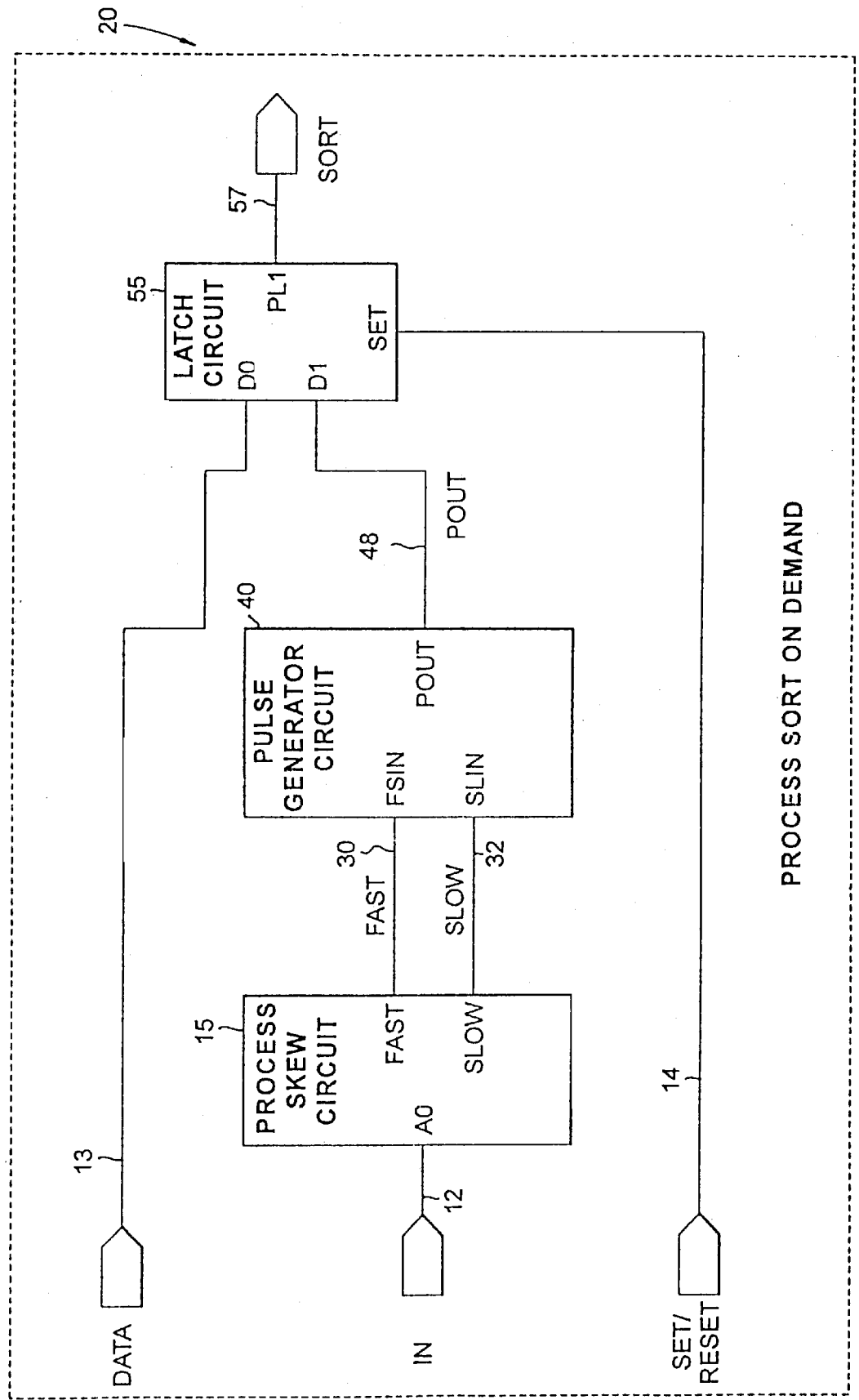
FIG. 1 illustrates an embodiment of the on-demand performance sorting apparatus of the invention.

FIG. 1 illustrates the process sort on demand ("process sort") circuit 20 which may be manufactured on a chip device. The process sort circuit 20 comprises a process skew circuit 15 for receiving an input test signal 12, a pulse generator circuit 40, and, a latch circuit 55. As will be described in greater detail, the process skew circuit 15 receives the input test signal 12, and generates two (2) output signals 30, 32. The pulse generator circuit 40 is responsive to the two signals 30, 32, for generating an output signal 48 which, according to a state of data input signal 13, is latched by latch circuit 55 as follows: depending if the manufacturing process for the chip is a fast manufacturing process, the latch output 57 state changes from logic "1" to logic "0" for sorting indication thereof, or, if the manufacturing process for the chip is a slow manufacturing process, the latch output 57 does not change the logic state. Thus, the logic level of output signal 57 of the latch circuit 55 indicates the performance of the chip, i.e., the process variation used in the corresponding chip manufacture, and how the device should be sorted.

Figure 2:
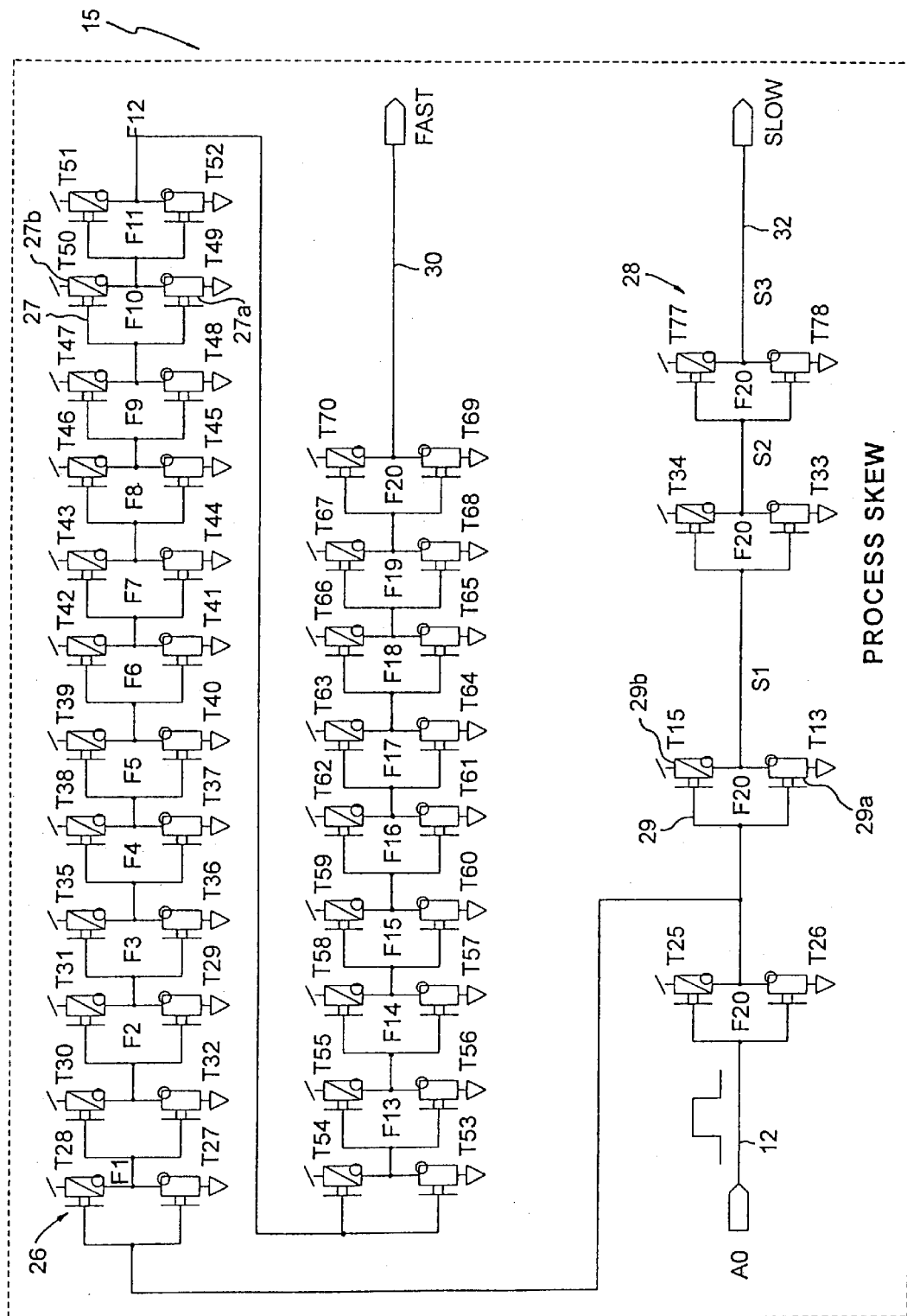
FIG. 2 is a circuit diagram illustrating the process skew circuit of the on-demand sorting apparatus.

FIG. 2 illustrates a detailed circuit diagram of the process skew circuit 15. As shown in FIG. 2, test input signal 12 is input through a first inverter stage 18 for simultaneous processing through a first delay circuit path 26 comprising a serial connection of one or more inverter circuit stages, e.g., fast stages labeled F1–F20, for providing a first output signal 30 of corresponding predetermined delay, depending upon the amount of stages, and, a second delay circuit path 28 comprising a serial connection of one or more inverter circuit stages, e.g., slower stages labeled S1–S3, for providing a second output signal 32 of corresponding predetermined delay. As will be described in greater detail, the calculated delay attributed to processing via the first (fast) circuit path 26 is equal to the calculated delay attributed to processing via the second (slow) circuit path 28. Preferably, each inverter stage of path 26 comprises a parallel connection of fixed-size transistors, with a stage 27 illustratively shown in FIG. 2 as comprising an NFET transistor 27a, and PFET transistor 27b. It should be understood that other FET/MOSFET transistor technologies may be implemented in the provision of inverter stages. According to the invention, each NFET transistor, 27a, of each inverter stage of first path 26, is of a fixed size, having a channel gate width, for example, of about 2.0 microns, and having a gate channel length, for example, of about 0.5 microns. Likewise, each PFET transistor, 27b, of each inverter stage of first path 26, is of a fixed size, having a channel gate width, for example, of 4.0 microns, and having a gate channel length, for example, of about 0.5 microns. The small gate width and channel length sizes of each transistor in first path 26 render path 26 very sensitive to process variation during chip manufacture. Likewise, each inverter stage of second path 28 comprised of a parallel connection of fixed-size transistors, with a stage 29 illustratively shown in FIG. 2 as being comprised of an N-FET transistor 29a, and P-FET transistor 29b. According to the preferred embodiment of the invention, the NFET transistor, 29a, of the inverter stage 29 is of a large size, having a channel gate width, for example, of about 6.0 microns, and having a gate channel length, for example, of about 4.5 microns. Likewise, the PFET transistor, 29b, of inverter stage 29 of first path 26, is of a large size, having a channel gate width, for example, of about 12.4 microns, and having a gate channel length, for example, of about 4.5 microns. The large gate width and channel length sizes of the transistors in stage 29 of second circuit path 28 render path 28 less sensitive to process variations occurring during chip manufacture. It should be understood that the second inverter stages labeled S2 and S3 of the second delay circuit path 28 in the skew circuit 15 of FIG. 2 are identical in size to the last two stages labeled F19 and F20 of the first delay circuit path 26. Thus, inverter stages F1–F18 of first delay circuit path 30 (sensitive to process manufacturing process variations during chip manufacture) is designed to provide the exact same delay as inverter circuit stage S1 of the second delay circuit path 28 (insensitive to manufacturing process variations during chip manufacture) at the nominal manufacturing process.

Figure 3A:
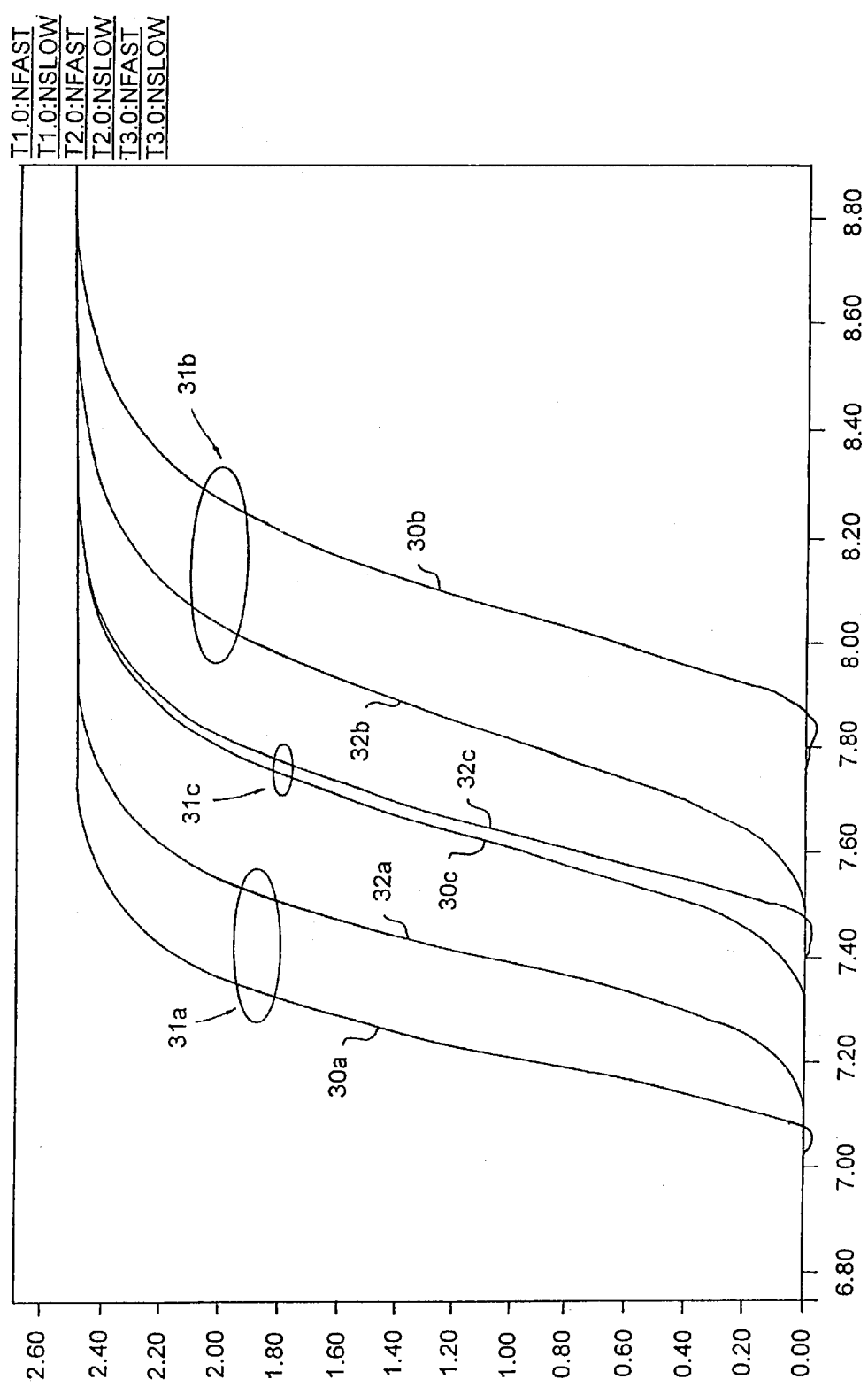
FIGS. 3(a) and 3(b) illustrate examples of process skew circuit output arrival times for rising [FIG. 3(a)] and falling outputs [FIG. 3(b)] on a high-performance side process, a typical-performance process, and a low-performance process.
Figure 3B:
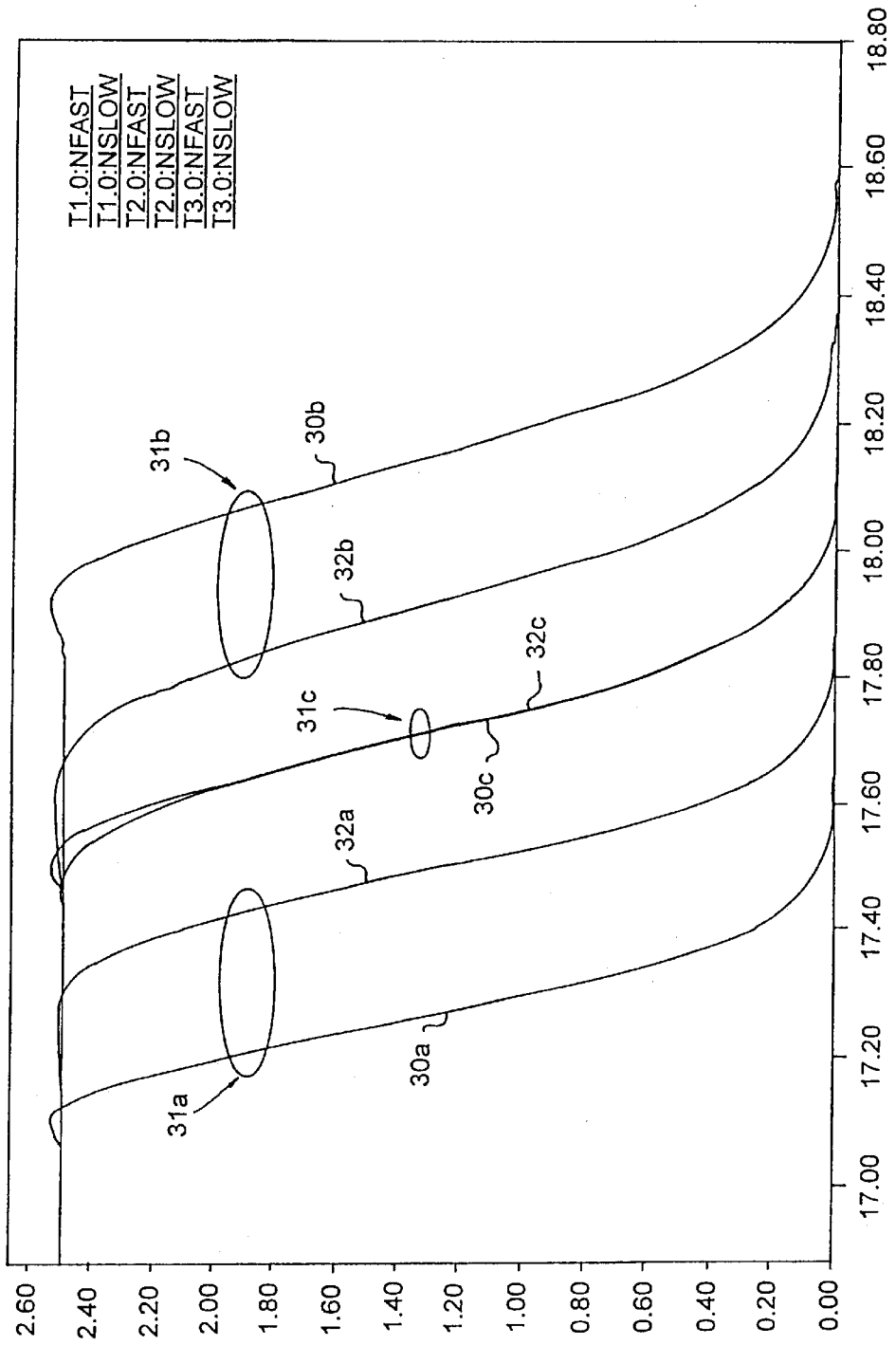

FIGS. 3(a) and 3(b) illustrate the best-case, worst-case and nominal case process output results of process skew circuit 15 corresponding to rising edge and falling edges, respectively, of an input test pulse signal 12. As mentioned, the device sizes of circuit delay paths and the number of stages are carefully chosen so that the delay of the first path 26 and the second path 28 are equal (or very close) at the nominal case process at the output of the process skew circuit. However, as the first path has many more delay circuits, as well as much smaller L effective circuits compared to the second path, because the second path delay inverter circuit device sizes (L effective) are much larger than the first path delay circuit device sizes (L effective) (see FIG. 2), advantage is taken of the L-effective (channel length) deviation. That is, as shown in FIGS. 3(a) and 3(b) for the best-case process when the chip is manufactured in a higher performance side process, then the first delay circuit path output 30a arrival time (rising and falling edges, respectively) on the process skew circuit is much earlier than the second delay circuit path output 32a arrival time. Contrarily, when the chip is manufactured in a lower performance side process 31b, then the first delay circuit path output arrival time 30b is much later than the second delay circuit path output 32b arrival time. In the nominal-case, 31c, there is virtually the same delay, i.e., the first delay circuit path output arrival time 30c is approximately equal to the second delay circuit path output 32c arrival time.

Figure 4:
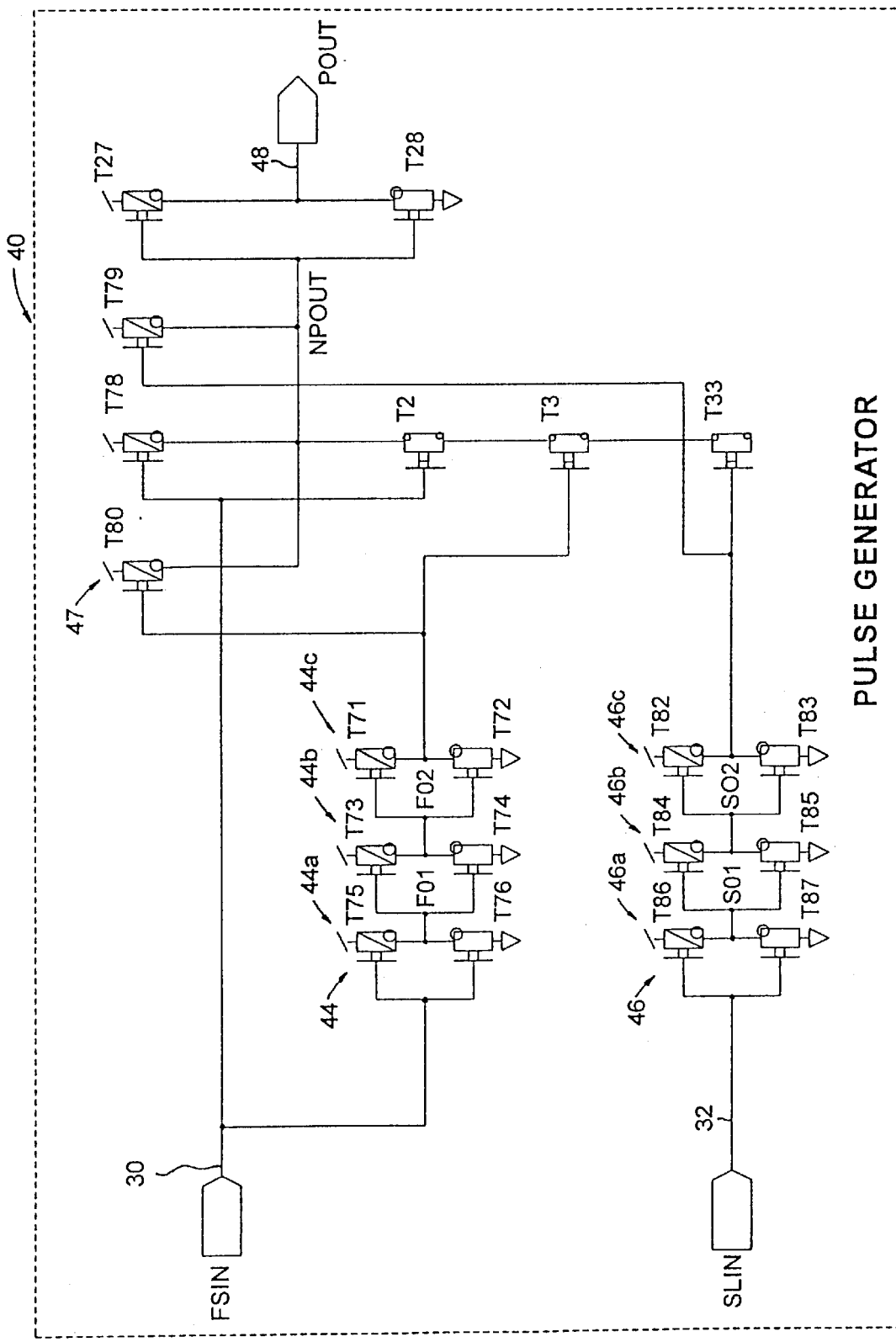
FIG. 4 is a circuit diagram illustrating the pulse generator circuit of the on-demand sorting apparatus.

FIG. 4 illustrates an embodiment of the pulse generator circuit 40 for receiving the first delay circuit path output 30 and the second delay circuit path output 32. Given the skew (variance) of output signal arrival times for the best-case, worst-case and nominal case scenarios (FIGS. 3(a) and 3(b)), the pulse generator circuit 40 generates a clock pulse 48 if there is detected enough delay between the first (fast) path and second (slow) path. Preferably, the pulse width of clock pulse 48 is controlled by the delay introduced by transistor device sizes of inverter stages 44a–44c, corresponding to a first delay path 44, device sizes provided in inverter stages 46a–46c of a second delay path 46, and device sizes of switch circuits 47. According to the invention, if the first delay circuit path output signal 30 is received by the pulse generator circuit 40 before the second delay circuit path output signal 32, then the pulse generator circuit 40 generates an output pulse signal 48 having a pulse width corresponding to the detected time delay difference. This pulse width is largely determined by the arrival of the output signal 30 which determines switching action of transistors T2 and T78, the delay introduced by inverter stages 44a–44c which determines switching action of transistor T3 and T80, and the delayed arrival of output signal 32 which determines switching action of transistor T33 and T79 through inverter stages 46a–46c. Thus, if the first delay circuit path output signal 30 arrives at or after the second delay circuit path output signal 32, the pulse generator circuit 40 does not generate as wide a pulse width at an output 48 or, alternately, may not generate any pulse. In view of FIG. 4, the pulse width is largely determined by the delay introduced in each circuit path 44 and 46, and switches T78 and T2 and provides a sorting point for controlling operation of latch 55, as will be described in further detail.

Referring back to FIG. 1, the last stage of the process sort circuit 20 is a latch circuit 55, for receiving the output signal 48 from the pulse generator circuit 40, and a data input signal 13. Preferably, the latch circuit 55 is of a typical design, e.g., two inverters in a cross-coupled structure, and its description is accordingly omitted. As shown in FIG. 1, the pulse generator output signal 48 acts as a clock input for latching the state of the input data signal 13 available at the data input of the latch 55. In one embodiment, the nominal case scenario (FIG. 5) is selected as the sort point such that, if the manufacturing process is slower than the nominal cases, the latch (sort) output 57 does not change the state indicating a nominal or slower chip; and, similarly, if the process exhibits a nominal or faster performance variation, then the latch output 57 changes its state, thus indicating a nominal or a faster chip manufacturing process. According to an alternate embodiment, depending upon the characteristics of the process skew circuits 15, the pulse generator circuit 40, and pulse generator output pulse width corresponding to the detected time delay difference between slow 32 and fast 30 circuit path (FIG. 4), if the chip manufacturing process is much faster than the nominal case, the latch output 57 may remain unchanged; and, likewise, if the process variation is much slower than the nominal case, then the latch output 57 may change its state. It should be understood that the sort point is scaleable.

Figure 5:
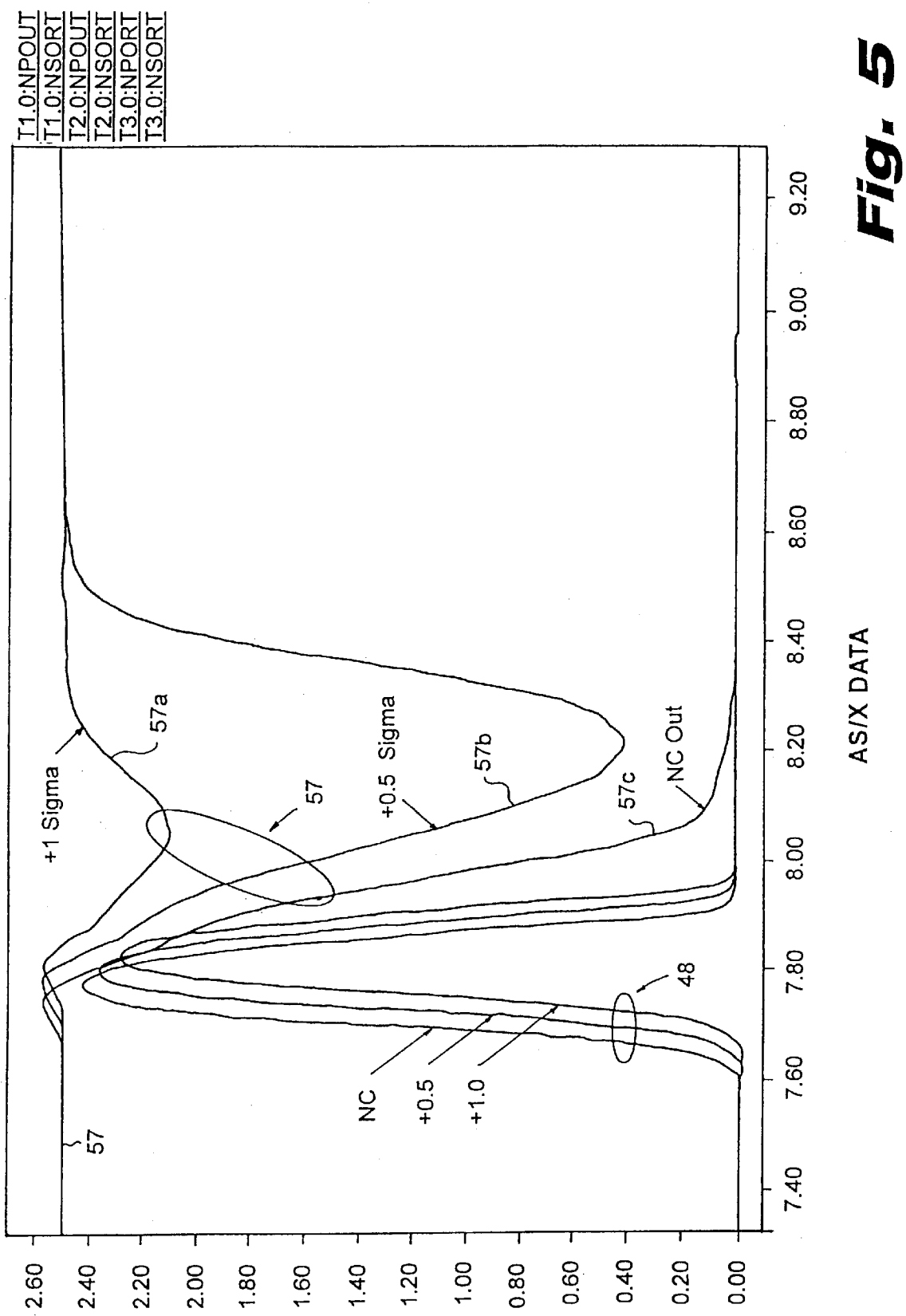
FIG. 5 illustrates latch circuit outputs of the on-demand process sorting apparatus for the nominal, slightly slower than nominal, and slower than nominal processes.

FIG. 5 illustrates various latch outputs corresponding to the following sort scenarios: nominal process manufacture; slightly slower than nominal process manufacture; and, slower process manufacture. In the slower process manufacture scenario, indicated by latch output signal 57a, the output latch does not completely change state as the input pulse generator output pulse 48 is not wide enough to permit latching action, i.e., the first delay path signal (of skew circuit 15) arrives slightly after the output signal of the second delay path signal of skew circuit 15, causing the pulse generator to generate output of small pulse width. Further to this, if the process is slightly slower than nominal, as indicated by latch output signal 57b on FIG. 5, the output latch tries to change state but does not as the input pulse generator output pulse 48 is still not wide enough to change the latch output state, i.e., the first delay path signal (of skew circuit 15) arrives slightly later than the output signal of the second delay path signal of skew circuit 15, causing the pulse generator to generate output of small pulse width, albeit larger than the case of latch output signal 57a, the latch output does not change its state. For the nominal case scenario, as indicated by latch output signal 57c, the output latch changes state as the first delay path signal (of skew circuit 15) arrives at the same time as the output signal of the second delay path signal of skew circuit 15, thus causing a pulse generator output pulse 48 having a slightly wider pulse width to permit latching action so that the latch output changes its state, thus indicating the nominal case scenario. It is understood that the process skew circuit 15 (FIG. 2) and the pulse generator circuit 40 (FIG. 4) dictate the pulse width of the latch circuit clock input, and hence, define the chip sorting criteria. Thus, as additionally shown in FIG. 5, pulse generator output signals 48*a*–48*c* indicate nominal, slightly slower, and slow chip process manufacture variation, causing latching action and corresponding latch output change of state.

FIG. 6 is a timing diagram illustrating the process sort on demand operation. In an initial step, data signal 13 is latched at the latch output 57, e.g., at a logic level "1" by toggling set/reset pulse 14 (FIG. 1) at latch circuit 55 set input, then the data input changes to 0. The input signal pulse 12 is then input to the process sort circuit and the output 57 will either remain at the logic level 1 if the process is slower than nominal, or, if the process is faster than nominal, change state, e.g., to a logic '0'.

While the invention has been particularly shown and described with respect to illustrative and preformed embodiments thereof, it will be understood by those skilled in the art that the foregoing and other changes in form and detail may be made therein without departing from the spirit and scope of the invention which should be limited only by the scope of the appended claims.

We claim:

1. A process sort test circuit for determining performance characteristic of an IC chip, the test circuit comprising:

an input for receiving an input signal;

a first path from the input to a first output for transmitting the input signal to the first output, the first path including one or more delay elements connected in series, each element including at least one transistor device having an effective channel length of a first size such that said first path is rendered sensitive to variations occurring during IC chip manufacture;

a second path from the input to a second output for transmitting the input signal to the second output, the second path including one or more delay elements connected in series, each element including at least one transistor device having an effective channel length of a second size such that said second path is rendered substantially less sensitive to variations occurring during IC chip manufacture, said first and second paths having a respective calculated delay substantially equal under nominal processing conditions; and a pulse generator device responsive to the first and second outputs, the pulse generator including means for detecting a difference in arrival times of the input signal at the first and second outputs and for outputting a delay signal if the difference is of a preselected magnitude, said delay signal indicating a performance characteristic of the IC chip.

2. The test circuit of claim 1, wherein the delay elements in said first and second paths comprise inverter devices.

3. The test circuit of claim 1, further comprising a latch device coupled to the pulse generator for processing the delay signal and providing said outward indication of IC chip performance characteristic.

4. The test circuit of claim 1, wherein said first path and said second path and said pulse generator device is located on said IC chip and manufactured according to a manufacturing process provided for said IC.

5. A method for determining performance characteristic of an IC chip, the method comprising:

receiving an input test signal; transmitting the input test signal through a first delay circuit to provide a first output, said first delay circuit comprising one or more delay elements connected in series, each element including at least one transistor device having an effective channel length of a first size such that said first path is rendered sensitive to variations occurring during IC chip manufacture;

simultaneously transmitting the input test signal through a second delay circuit to provide a second output, said second delay circuit comprising one or more delay elements connection in series, each element including at least one transistor device having an effective channel length of a second size such that said second path is rendered substantially less sensitive to variations occurring during IC chip manufacture, said first and second paths having a respective calculated delay substantially equal processing conditions; and detecting a difference in arrival times of the signal at the first and second outputs; and, outputting a delay signal if the difference is of a preselected magnitude, said delay signal providing output indication of a performance characteristic of the IC chip.

6. The method as claimed in claim 5, further comprising the step of latching said delay signal and providing said outward indication of IC chip performance characteristic according to said delay signal.

* * * * *